United States Patent
Arai et al.

(10) Patent No.: US 9,730,332 B2
(45) Date of Patent: *Aug. 8, 2017

(54) SURFACE TREATED COPPER FOIL AND LAMINATE USING THE SAME, PRINTED WIRING BOARD, AND COPPER CLAD LAMINATE

(71) Applicant: JX Nippon Mining & Metals Corporation, Tokyo (JP)

(72) Inventors: Hideta Arai, Hitachi (JP); Atsushi Miki, Hitachi (JP); Kohsuke Arai, Hitachi (JP); Kaichiro Nakamuro, Kanagawa (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 11 days.

This patent is subject to a terminal disclaimer.

(21) Appl. No.: 14/342,288

(22) PCT Filed: Nov. 11, 2013

(86) PCT No.: PCT/JP2013/080477
§ 371 (c)(1),
(2) Date: Feb. 28, 2014

(87) PCT Pub. No.: WO2014/073692
PCT Pub. Date: May 15, 2014

(65) Prior Publication Data
US 2015/0237737 A1    Aug. 20, 2015

(30) Foreign Application Priority Data

Nov. 9, 2012  (JP) .................................. 2012-247925
Dec. 11, 2012  (JP) .................................. 2012-270728

(51) Int. Cl.
*B32B 15/01* (2006.01)
*H05K 1/05* (2006.01)
(Continued)

(52) U.S. Cl.
CPC ............. *H05K 3/022* (2013.01); *H05K 1/028* (2013.01); *H05K 1/0346* (2013.01); *H05K 1/09* (2013.01);
(Continued)

(58) Field of Classification Search
CPC ...................................................... B32B 15/01
(Continued)

(56) References Cited

U.S. PATENT DOCUMENTS

2004/0163842 A1    8/2004  Okada et al.
2012/0285734 A1*  11/2012  Uno et al. ..................... 174/257
2014/0030591 A1    1/2014  Kohiki et al.

FOREIGN PATENT DOCUMENTS

EP    2692904 A1    2/2014
JP    H0987889 A    3/1997
(Continued)

OTHER PUBLICATIONS

English machine translation of JP H09-087889, JPO, accessed Jun. 19, 2014.*

*Primary Examiner* — Humera Sheikh
*Assistant Examiner* — Lucas Wang
(74) *Attorney, Agent, or Firm* — Marshall, Gerstein & Borun LLP

(57) ABSTRACT

A surface treated copper foil which is well bonded to a resin and achieves excellent visibility when observed through the resin, and a laminate using the same are provided. The surface treated copper foil to be laminated on a polyimide having the following ΔB (PI) of 50 or more and 65 or less before being laminated to the copper foil so as to form a (Continued)

(a) IN THE CASE OF V-SHAPED BRIGHTNESS CURVE (b) IN THE CASE OF BOTTOMED BRIGHTNESS CURVE copper clad laminate comprising a surface having a color difference ΔE*ab of 50 or more based on JIS Z 8730 through the polyimide and a difference between the top average Bt and the bottom average Bb in a brightness curve extending from an edge of the copper foil to a portion without the copper foil ΔB (ΔB=Bt−Bb) of 40 or more, wherein the brightness curve is obtained from an observation spot versus brightness graph of measurement results of the brightness of the photographed image of the copper foil through the polyimide laminated from the surface treated surface side with a CCD camera for the respective observation spots along the perpendicular direction of the extending direction of the observed copper foil.

20 Claims, 3 Drawing Sheets

(51) Int. Cl.
| | |
|---|---|
| *C25D 1/04* | (2006.01) |
| *H05K 3/02* | (2006.01) |
| *H05K 1/03* | (2006.01) |
| *H05K 1/09* | (2006.01) |
| *H05K 3/36* | (2006.01) |
| *H05K 1/14* | (2006.01) |
| *H05K 1/02* | (2006.01) |

(52) U.S. Cl.
CPC ............... *H05K 1/14* (2013.01); *H05K 3/361* (2013.01); *H05K 2201/0154* (2013.01); *H05K 2201/0317* (2013.01); *H05K 2201/0355* (2013.01); *H05K 2201/05* (2013.01); *H05K 2201/058* (2013.01); *Y10T 29/49126* (2015.01); *Y10T 428/12431* (2015.01); *Y10T 428/24917* (2015.01); *Y10T 428/31681* (2015.04)

(58) Field of Classification Search
USPC .......................... 428/209, 674, 675, 621–626
See application file for complete search history.

(56) References Cited

FOREIGN PATENT DOCUMENTS

| | | |
|---|---|---|
| JP | 2849059 B2 | 1/1999 |
| JP | 2004098659 A | 4/2004 |
| JP | 2011240625 A | 12/2011 |
| JP | 2012211351 A | 11/2012 |
| JP | 2012212529 A | 11/2012 |
| JP | 2012224941 A | 11/2012 |
| WO | WO-03096776 A1 | 11/2003 |
| WO | WO-2012133564 A1 | 10/2012 |
| WO | WO-2012133565 A1 | 10/2012 |

* cited by examiner (a) IN THE CASE OF V-SHAPED BRIGHTNESS CURVE (b) IN THE CASE OF BOTTOMED BRIGHTNESS CURVE

SURFACE TREATED COPPER FOIL AND LAMINATE USING THE SAME, PRINTED WIRING BOARD, AND COPPER CLAD LAMINATE

TECHNICAL FIELD

The present invention relates to a surface treated copper foil and a laminate using the same, a printed wiring board, and a copper clad laminate.

BACKGROUND ART

A flexible printed wiring board (hereinafter referred to as FPC) is employed in a compact electronic apparatus such as a smart phone and a tablet PC due to the easiness of wiring and the lightness. Due to the recent improvement of functionality of electronic apparatuses, the signal transmission rate has been accelerated, so that impedance matching is an important factor even for an FPC. In order to achieve impedance matching for the increased signal capacity, a resin insulating layer (e.g., polyimide) as the base of an FPC has been thickened. In order to meet the demand for densification of wirings, multilayering of an FPC has been further developed. On the other hand, when an FPC is processed for bonding to a liquid crystal substrate and mounting an IC chip, alignment is performed with a positioning pattern which is visually recognized through a resin insulating layer remained after etching of the copper foil of a laminate composed of the copper foil and the resin insulating layer. The visibility of the resin insulating layer is therefore important.

A copper clad laminate composed of a laminate of a copper foil and a resin insulating layer may be manufactured from a rolled copper foil having a roughened plated surface. The rolled copper foil is usually manufactured from tough pitch copper (oxygen content: 100 to 500 ppm by weight) or oxygen-free copper (oxygen content: 10 ppm by weight or less) as a raw material ingot, which is hot rolled and then subjected to repeated cold rolling and annealing to a predetermined thickness.

Examples of the techniques include the followings. Patent Literature 1 discloses an invention of a copper clad laminate of a polyimide film and a low profile copper foil, which allows a film after etching of the copper foil to have a light transmittance of 40% or more at a wavelength of 600 nm, with a haze value (HAZE) of 30% or less and an adhesive strength of 500 N/m or more.

Patent Literature 2 discloses an invention of a chip on flexible (COF) flexible printed wiring board having an insulating layer on which a conductive layer of electrolytic copper foil is laminated, allowing the insulating layer in an etched region after circuit formation by etching of the conductive layer to have a light transmittance of 50% or more. The electrolytic copper foil includes a rustproof layer of nickel-zinc alloy at the joint area bonded to the insulating layer. The joint area has a surface roughness (Rz) of 0.05 to 1.5 μm and a specular gloss of 250 or more at an incident angle of 60°.

Patent Literature 3 discloses an invention of a method for processing a copper foil for a printed circuit, including forming a cobalt-nickel alloy plated layer after surface roughening treatment of the copper foil surface by plating with a copper-cobalt-nickel alloy, and further forming a zinc-nickel alloy plated layer.

CITATION LIST

Patent Literature

[Patent Literature 1]
Japanese Patent Laid-Open No. 2004-98659
[Patent Literature 2]
International Publication No. WO 2003/096776
[Patent Literature 3]
Japanese Patent No. 2849059

SUMMARY OF INVENTION

Technical Problem

In Patent Literature 1, the adhesiveness of a low profile copper foil is improved by blackening treatment or with an organic treating agent after plating treatment. The copper foil causes disconnection due to fatigue in some cases for use in need of flexibility of a copper clad laminate, and has poor transparency of a resin in some cases.

In Patent Literature 2, since no roughening treatment is performed, the adhesion strength between a copper foil and a resin is low and insufficient for use other than as a COF flexible printed wiring board.

Furthermore, in the processing method according to Patent Literature 3, although the refinement treatment of a copper foil is feasible with Cu—Co—Ni, excellent visibility cannot be achieved when the copper foil is observed through a resin.

The present invention provides a surface treated copper foil which is well bonded to a resin and achieves excellent visibility when observed through the resin, a laminate using the same, a printed wiring board, and a copper clad laminate.

Solution to Problem

As a result of earnest research effort, the present inventors found that the excellent transparency of a resin can be achieved without influence of the type and the thickness of a substrate resin film by the following. A copper foil which is controlled to have a surface color difference in a predetermined range by surface treatment is photographed through a polyimide substrate laminated on the treated surface with a CCD camera. A graph of observation spot versus brightness is produced from the image. An attention is paid to the gradient of the brightness curve drawn in the graph in the vicinity of the edge of the copper foil such that the gradient of the brightness curve is controlled.

An aspect of the present invention accomplished based on the finding is:

a surface treated copper foil to be laminated on a polyimide having a ΔB (PI) to be defined as follows of 50 or more and 65 or less before being laminated to the copper foil so as to form a copper clad laminate comprising:

a surface having a color difference ΔE*ab of 50 or more based on JIS Z 8730 through the polyimide laminated on the copper foil; and a difference between the top average Bt and the bottom average Bb in a brightness curve extending from an edge of the copper foil to a portion without the copper foil ΔB (ΔB=Bt−Bb) of 40 or more;

wherein the brightness curve is obtained from an observation spot versus brightness graph of measurement results of the brightness of the photographed image of the copper foil through the polyimide laminated on the copper foil from the surface treated surface side of the copper foil with a CCD camera for the respective observation spots along the direction perpendicular to the extending direction of the observed copper foil.

Another aspect of the present invention is:

a surface treated copper foil to be laminated on a polyimide having a ΔB (PI) to be defined as follows of 50 or more and 65 or less before being laminated to the copper foil so as to form a copper clad laminate comprising:

a surface having a color difference ΔE*ab of 50 or more based on JIS Z 8730 through the polyimide laminated on the copper foil; and an Sv defined by the following expression (1) of 3.0 or more based on a brightness curve:

$$Sv=(\Delta B \times 0.1)/(t1-t2) \quad (1);$$

wherein the brightness curve is obtained from an observation spot versus brightness graph of measurement results of the brightness of the photographed image of the copper foil through the polyimide laminated on the copper foil from the surface treated surface side of the copper foil with a CCD camera for the respective observation spots along the direction perpendicular to the extending direction of the observed copper foil, and the difference between the top average Bt and the bottom average Bb in the brightness curve extending from an edge of the copper foil to a portion without the copper foil is represented by ΔB (ΔB=Bt−Bb); and wherein t1 represents a value pointing the position of the intersection closest to the copper foil among the intersections of the brightness curve and Bt in the observation spot versus brightness graph, and t2 represents a value pointing the position of the intersection closest to the copper foil among the intersections of the brightness curve and 0.1ΔB in the range from the intersections of the brightness curve and Bt to a depth of 0.1 ΔB with Bt as reference.

In another embodiment of the surface treated copper foil of the present invention, an Sv defined by the following expression (1) is 3.0 or more:

$$Sv=(\Delta B \times 0.1)/(t1-t2) \quad (1);$$

wherein t1 represents a value pointing the position of the intersection closest to the copper foil among the intersections of the brightness curve and Bt in the observation spot versus brightness graph, and t2 represents a value pointing the position of the intersection closest to the copper foil among the intersections of the brightness curve and 0.1ΔB in the range from the intersections of the brightness curve and Bt to a depth of 0.1 ΔB with Bt as reference.

In further another embodiment of the surface treated copper foil of the present invention, the surface treated copper foil is laminated on a polyimide having a ΔB (PI) to be defined as follows of 50 or more and 65 or less before being laminated to the copper foil so as to form a copper clad laminate, wherein the surface has a color difference ΔE*ab of 53 or more based on JIS Z 8730 through the polyimide.

In further another embodiment of the surface treated copper foil of the present invention, the Sv defined by the expression (1) in the brightness curve is 3.5 or more.

In further another embodiment of the surface treated copper foil of the present invention, the Sv defined by the expression (1) in the brightness curve is 3.9 or more.

In further another embodiment of the surface treated copper foil of the present invention, the Sv defined by the expression (1) in the brightness curve is 5.0 or more.

In further another embodiment of the surface treated copper foil of the present invention, the surface has a TD average roughness Rz of 0.20 to 0.64 μm, and the copper foil surface has a three-dimensional surface area A to two-dimensional surface area B ratio A/B of 1.0 to 1.7.

In further another embodiment of the surface treated copper foil of the present invention, the surface has a TD average roughness Rz of 0.26 to 0.62 μm.

In further another embodiment of the surface treated copper foil of the present invention, the A/B is 1.0 to 1.6.

Further another aspect of the present invention is a laminate including a lamination of the surface treated copper foil of the present invention and a resin substrate.

Further another aspect of the present invention is a printed wiring board comprising the surface treated copper foil of the present invention.

Further another aspect of the present invention is an electronic apparatus comprising at least one of the printed wiring board of the present invention.

Further another aspect of the present invention is a printed wiring board including an insulating resin substrate and a copper circuit arranged on the insulating resin substrate comprising:

a surface of the copper circuit having a color difference ΔE*ab of 50 or more based on JIS Z 8730 through the insulating resin substrate; and a difference between the top average Bt and the bottom average Bb in a brightness curve extending from an edge of the copper circuit to a portion without the copper circuit ΔB (ΔB=Bt−Bb) of 40 or more;

wherein the brightness curve is obtained from an observation spot versus brightness graph of measurement results of the brightness of the photographed image of the copper circuit through the insulating resin substrate with a CCD camera for the respective observation spots along the direction perpendicular to the extending direction of the observed copper circuit.

Further another aspect of the present invention is a copper clad laminate including an insulating resin substrate and a copper foil arranged on the insulating resin substrate comprising:

a surface of the copper foil having a color difference ΔE*ab of 50 or more based on JIS Z 8730 through the insulating resin substrate; and a difference between the top average Bt and the bottom average Bb in a brightness curve extending from an edge of a linear copper foil to a portion without the linear copper foil ΔB (ΔB=Bt−Bb) of 40 or more;

wherein the brightness curve is obtained from an observation spot versus brightness graph of measurement results of the brightness of the photographed image of the copper foil of the copper clad laminate after being etched into the linear copper foil through the insulating resin substrate with a CCD camera for the respective observation spots along the direction perpendicular to the extending direction of the observed linear copper foil.

Further another aspect of the present invention is a printed wiring board including an insulating resin substrate and a copper circuit arranged on the insulating resin substrate comprising:

a surface of the copper circuit having a color difference ΔE*ab of 50 or more based on JIS Z 8730 through the insulating resin substrate; and an Sv defined by the following expression (1) of 3.0 or more based on a brightness curve:

$$Sv=(\Delta B \times 0.1)/(t1-t2) \quad (1);$$

wherein the brightness curve is obtained from an observation spot versus brightness graph of measurement results of the brightness of the photographed image of the copper circuit through the insulating resin substrate with a CCD camera for the respective observation spots along the direction perpendicular to the extending direction of the observed copper circuit, and the difference between the top average Bt and the bottom average Bb in the brightness curve extending from an edge of the copper circuit to a portion without the copper circuit is represented by ΔB (ΔB=Bt−Bb); and wherein t1 represents a value pointing the position of the intersection closest to the copper circuit among the intersections of the brightness curve and Bt in the observation spot versus brightness graph, and t2 represents a value pointing the position of the intersection closest to the copper circuit among the intersections of the brightness curve and 0.1ΔB in the range from the intersections of the brightness curve and Bt to a depth of 0.1 ΔB with Bt as reference.

Further another aspect of the present invention is a copper clad laminate including an insulating resin substrate and a copper foil arranged on the insulating resin substrate comprising:

a surface of the copper foil having a color difference ΔE*ab of 50 or more based on JIS Z 8730 through the insulating resin substrate; and an Sv defined by the following expression (1) of 3.0 or more based on a brightness curve:

$$Sv=(\Delta B \times 0.1)/(t1-t2) \qquad (1);$$

wherein the brightness curve is obtained from an observation spot versus brightness graph of measurement results of the brightness of the photographed image of the copper foil of the copper clad laminate after being etched into a linear copper foil through the insulating resin substrate with a CCD camera for the respective observation spots along the direction perpendicular to the extending direction of the observed linear copper foil, and the difference between the top average Bt and the bottom average Bb in the brightness curve extending from an edge of the linear copper foil to a portion without the linear copper foil is represented by ΔB (ΔB=Bt−Bb); and wherein t1 represents a value pointing the position of the intersection closest to the linear copper foil among the intersections of the brightness curve and Bt in the observation spot versus brightness graph, and t2 represents a value pointing the position of the intersection closest to the linear copper foil among the intersections of the brightness curve and 0.1ΔB in the range from the intersections of the brightness curve and Bt to a depth of 0.1ΔB with Bt as reference.

Further another aspect of the present invention is a method for manufacturing a printed wiring board having two or more connected printed wiring boards comprising connecting two or more of the printed wiring boards of the present invention.

Further another aspect of the present invention is a method for manufacturing a printed wiring board having two or more connected printed wiring boards comprising the step of connecting at least one printed wiring board of the present invention to another printed wiring board of the present invention or to a printed wiring board other than the printed wiring board of the present invention.

Further another aspect of the present invention is an electronic apparatus comprising at least one printed wiring board connected to at least one printed wiring board of the present invention.

Further another aspect of the present invention is a surface treated copper foil used using in the printed wiring board of the present invention.

Further another aspect of the present invention is a surface treated copper foil for use in the copper clad laminate of the present invention.

Advantageous Effects of Invention

According to the present invention, a surface treated copper foil which is well bonded to a resin and achieves excellent visibility when observed through the resin, a laminate using the same, a printed wiring board, and a copper clad laminate can be provided.

Figure 1:
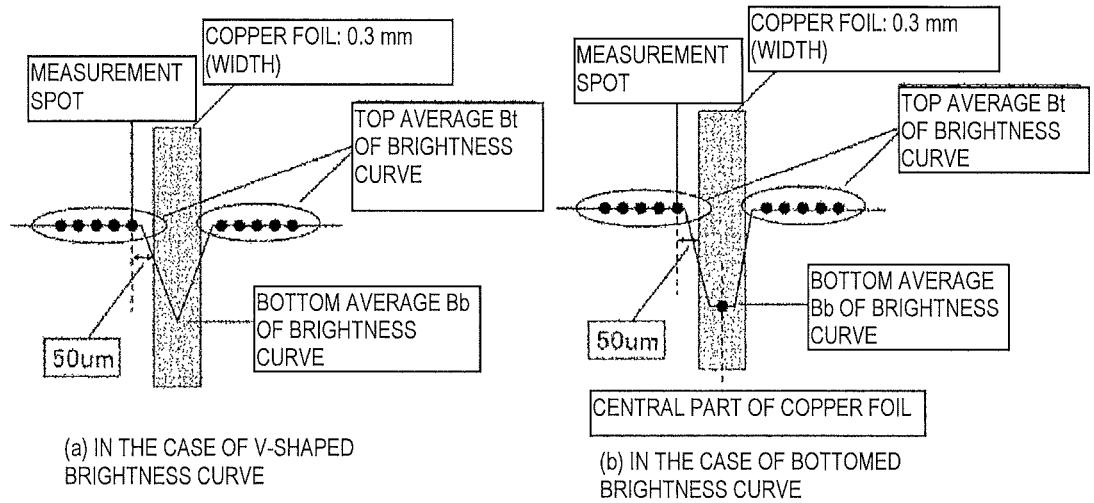
FIG. 1 is a schematic diagram for defining Bt and Bb.

DESCRIPTION OF EMBODIMENTS (Aspect of Surface Treated Copper Foil and Manufacturing Method Thereof)

A copper foil for use in the present invention is effectively used for a copper foil which is laminated on a resin substrate so as to produce a laminate which is then etched to form a circuit.

The copper foil for use in the present invention may be any one of an electrolyte copper foil and a rolled copper foil. The joint area of a copper foil to be bonded to a resin substrate, i.e., the surface treated surface, may be usually subject to a roughening treatment by electrodeposition for forming a knotty copper foil surface after degreasing, in order to improve the peel strength of the copper foil after lamination. Although an electrolyte copper foil has irregularities when manufactured, the irregularities can be further enlarged with roughening treatment for enhancing the projection portion of the electrolyte copper foil. In the present invention, the roughening treatment can be performed by alloy plating such as copper-cobalt-nickel alloy plating and copper-nickel-phosphorus alloy plating, preferably by copper alloy plating. Common copper plating or the like may be performed as a pre-treatment before roughening in some cases, and common copper plating or the like may be also performed as a finishing treatment after roughening so as to prevent the detachment of an electrodeposited material in some cases.

The surface of a copper foil for use in the present invention may be provided with a heat-resistant plating layer or a rustproof plating layer, after a roughening treatment or without a roughening treatment. A plating treatment with a Ni—W plating bath under the following conditions may be employed as a surface treatment for applying the heat-resistant plating layer or a rustproof plating layer to the surface without a roughening treatment:

Plating bath composition: Ni: 20 to 30 g/L, and W: 15 to 40 mg/L;

pH: 3.0 to 4.0;
Temperature: 35 to 45° C.;
Current density $D_k$: 1.7 to 2.3 A/dm$^2$; and
Plating time: 18 to 25 sec.

The thickness of a copper foil for use in the present invention is not specifically limited, including, for example, 1 μm or more, 2 μm or more, 3 μm or more, 5 μm or more, and, for example, 3,000 μm or less, 1,500 μm or less, 800 μm or less, 300 μm or less, 150 μm or less, 100 μm or less, 70 μm or less, 50 μm or less, and 40 μm or less.

Examples of the rolled copper foil of the present invention include a copper alloy foil which contains at least one element such as Ag, Sn, In, Ti, Zn, Zr, Fe, P, Ni, Si, Te, Cr, Nb, V, B, and Co. With high concentration of the elements (e.g., 10 mass % or more in total), the conductivity may be reduced in some cases. The conductivity of a rolled copper foil is preferably 50% IACS or more, more preferably 60% IACS or more, further preferably 80% IACS or more. Examples of the rolled copper foil include a copper foil made from tough pitch copper (JIS H 3100 and JIS C 1100) and oxygen free copper (JIS H 3100 and JIS C 1020).

The manufacturing conditions of electrolyte copper foil for use in the present invention are as follows:
<Electrolyte composition>
Copper: 90 to 110 g/L;
Sulfuric acid: 90 to 110 g/L;
Chlorine: 50 to 100 ppm;
Leveling agent 1 (bis(3-sulfopropyl)disulfide): 10 to 30 ppm; and
Leveling agent 2 (amine compound): 10 to 30 ppm.

The amine compound represented by the following formula may be used as the above-mentioned amine compound.

[Formula 1]

$$\begin{array}{l}CH_2-O-CH_2-\underset{\underset{OH}{|}}{CH}-CH_2-N\diagdown_{R_2}^{R_1}\\ CH-O-CH_2-\underset{\underset{OH}{|}}{CH}-CH_2-N\diagdown_{R_2}^{R_1}\\ CH_2-O-CH_2-\underset{\underset{OH}{|}}{CH}-CH_2-N\diagdown_{R_2}^{R_1}\end{array}$$

(In the chemical formula, $R_1$ and $R_2$ are selected from the group consisting of a hydroxyalkyl group, an ether group, an aryl group, an aromatic substituted alkyl group, an unsaturated hydrocarbon group, and an alkyl group.)

<Manufacturing conditions>
Current density: 70 to 100 A/dm$^2$;
Electrolyte temperature: 50 to 60° C.;
Linear velocity of electrolyte: 3 to 5 m/sec; and
Electrolysis time: 0.5 to 10 min.

In copper-cobalt-nickel alloy plating as roughening treatment, electroplating may be performed such that a ternary alloy layer with deposition amounts of copper of 15 to 40 mg/dm$^2$, cobalt of 100 to 3,000 μg/dm$^2$, and nickel of 100 to 1,500 μg/dm$^2$ is formed. A deposition amount of Co less than 100 μg/dm$^2$ may cause degradation of heat resistance and etching properties in some cases. A deposition amount of Co more than 3,000 μg/dm$^2$ is not suitable in the case that effects of magnetic properties have to be considered, causing etching stains with reduced acid resistance and chemical resistance in some cases. A deposition amount of Ni less than 100 μg/dm$^2$ may cause degradation of heat resistance. On the other hand, a deposition amount of Ni more than 1,500 μg/dm$^2$ may increase the amount of etching residue in some cases. The preferable deposition amount of Co is 1,000 to 2,500 μg/dm$^2$, and the preferable deposition amount of Nickel is 500 to 1,200 μg/dm$^2$. In the specification, the presence of etching stains means that Co remains undissolved in etching with copper chloride, and the presence of etching residue means that Ni remains undissolved in alkali etching with ammonium chloride.

The plating bath and the plating conditions for forming the ternary copper-cobalt-nickel alloy plating are as follows:
Plating bath composition: Cu: 10 to 20 g/L, Co: 1 to 10 g/L, and Ni: 1 to 10 g/L;
pH: 1 to 4;
Temperature: 30 to 50° C.;
Current density $D_k$: 35 to 45 A/dm$^2$; and
Plating time: 1 to 5 sec.

The conditions for copper-nickel-phosphorus alloy plating as roughening treatment of the present invention are as follows:
Plating bath composition: Cu: 10 to 50 g/L, Ni: 3 to 20 g/L, and P: 1 to 10 g/L;
pH: 1 to 4;
Temperature: 30 to 40° C.;
Current density $D_k$: 20 to 50 A/dm$^2$; and
Plating time: 0.5 to 3 sec The conditions for copper-nickel-cobalt-tungsten alloy plating as roughening treatment of the present invention are as follows:
Plating bath composition: Cu: 5 to 20 g/L, Ni: 5 to 20 g/L, Co: 5 to 20 g/L, and W: 1 to 10 g/L;
pH: 1 to 5;
Temperature: 30 to 50° C.;
Current density $D_k$: 20 to 50 A/dm$^2$; and
Plating time: 0.5 to 5 sec.

The conditions for copper-nickel-molybdenum-phosphorus alloy plating as roughening treatment of the present invention are as follows:
Plating bath composition: Cu: 5 to 20 g/L, Ni: 5 to 20 g/L, Mo: 1 to 10 g/L, and P: 1 to 10 g/L;
pH: 1 to 5;
Temperature: 20 to 50° C.;
Current density $D_k$: 20 to 50 A/dm$^2$; and
Plating time: 0.5 to 5 sec.

After the roughening treatment, a cobalt-nickel alloy plating layer having deposition amounts of cobalt of 200 to 3,000 μg/dm$^2$ and nickel of 100 to 700 μg/dm$^2$ on the roughened surface may be formed. This treatment can be regarded as a kind of rustproof treatment in a broad sense. The cobalt-nickel alloy plating layer needs to be formed to an extent not to substantially reduce the adhesion strength between the copper foil and the substrate. A deposition amount of cobalt less than 200 μg/dm$^2$ may cause reduction of heat resistant peel strength with degraded oxidation resistance and chemical resistance in some cases. In addition, another reason that a small amount of cobalt is not preferred is that the treated surface has a reddish color. A deposition amount of cobalt more than 3,000 μg/dm$^2$ is not suitable in the case that effects of magnetic properties have to be considered, causing etching stains with reduced acid resistance and chemical resistance in some cases. The preferable deposition amount of cobalt is 500 to 2,500 μg/dm$^2$. On the other hand, a deposition amount of nickel less than 100 μg/dm² may cause reduction of heat resistant peel strength with degraded oxidation resistance and chemical resistance in some cases. An amount of nickel more than 1,300 μg/dm² results in poor alkali etching properties. The preferable deposition amount of nickel is 200 to 1,200 μg/dm².

The conditions for cobalt-nickel alloy plating are as follows:

Plating bath composition: Co: 1 to 20 g/L and Ni: 1 to 20 g/L;
pH: 1.5 to 3.5;
Temperature: 30 to 80° C.;
Current density $D_k$: 1.0 to 20.0 A/dm²; and
Plating time: 0.5 to 4 sec.

According to the present invention, a zinc plating layer with a deposition amount of 30 to 250 μg/dm² is further formed on a cobalt-nickel alloy plating layer. A deposition amount of zinc less than 30 μg/dm² may eliminate the effect for improving the degradation rate of heat resistance in some cases. On the other hand, a deposition amount of zinc more than 250 μg/dm² may drastically worsen the degradation rate of hydrochloric acid resistance in some cases. The deposition amount of zinc is preferably 30 to 240 μg/dm², more preferably 80 to 220 μg/dm².

The conditions for the zinc plating are as follows:
Plating bath composition: Zn: 100 to 300 g/L;
pH: 3 to 4;
Temperature: 50 to 60° C.;
Current density $D_k$: 0.1 to 0.5 A/dm²; and
Plating time: 1 to 3 sec.

Alternatively, a plating layer of zinc alloy such as that of zinc-nickel alloy may be formed instead of the zinc plating layer. On the outermost surface, a rustproof layer may be further formed by treatment such as chromating or application of a silane coupling agent.

Burnt plating in an aqueous solution of copper sulfate is a conventional technique usually employed for roughening the surface of a copper foil. Alloy plating with a plating bath including a metal other than copper such as copper-cobalt-nickel alloy plating and copper-nickel-phosphorus alloy plating is a surface treatment which allows the surface of a copper clad laminate of lamination of a copper foil and a polyimide having a ΔB (PI) of 50 or more and 65 or less before being laminated to the copper foil to have a color difference ΔE*ab of 50 or more based on JIS Z 8730 through the polyimide.

(Surface Color Difference ΔE*ab)

The surface treated copper foil of the present invention laminated on a polyimide having a ΔB (PI), which is defined in the following, of 50 or more and 65 or less before being laminated to the copper foil so as to form a copper clad laminate is controlled to have a surface color difference ΔE*ab of 50 or more based on JIS Z 8730 through the polyimide. This configuration allows for clear contrast to the back surface, improving the visibility of the copper foil observed through the polyimide substrate. As a result, use of the copper foil in forming a circuit allows for easy alignment of an IC chip to be mounted with a positioning pattern which is visually recognized through the polyimide resin. In the case that the color difference ΔE*ab is less than 50, unclear contrast to the back surface may be caused. The color difference ΔE*ab is more preferably 53 or more, further preferably 55 or more, and furthermore preferably 60 or more. It is not needed to specify the upper limit of the color difference ΔE*ab, which may be, for example, 90 or less, 88 or less, 87 or less, 85 or less, 75 or less, or 70 or less.

In the specification, the color difference ΔE*ab is measured by a color difference meter, and represented by the following expression as a comprehensive index indicated by using the L*a*b colorimetric system based on JIS Z 8730 regarding black/white/red/green/yellow/blue colors, with ΔL: white and black, Δa: red and green, and Δb: yellow and blue.

$$\Delta E^*ab = \sqrt{\Delta L^2 + \Delta a^2 + \Delta b^2}$$ [Expression 1]

(Average Roughness Rz of Copper Foil Surface)

The surface treated copper foil of the present invention may be a non-roughening treated copper foil or a roughening treated copper foil having roughened grains. The roughening treated surface has a TD average roughness Rz of preferably 0.20 to 0.64 μm. Such a configuration allows for good adhesion to a resin with increased peel strength, improving the transparency of the resin after removal of the copper foil by etching. Consequently alignment of an IC chip to be mounted with a positioning pattern which is visually recognized through the resin can be easily performed. A TD average roughness Rz less than 0.20 μm may result in an insufficient roughening treatment of the copper foil surface, which may cause a problem of insufficient adhesion to the resin. On the other hand, a TD average roughness Rz more than 0.64 μm may allow irregularities of the resin surface to be enlarged after removal of the copper foil by etching, which may cause a problem of defect in transparency of the resin. The TD average roughness Rz of a treated surface is more preferably 0.26 to 0.62 μm, further preferably 0.40 to 0.55 μm.

In order to achieve the visibility effect, the TD surface roughness (Rz) and the glossiness on the treatment side of a copper foil are controlled before the surface treatment. Specifically, the TD surface roughness (Rz) of the copper foil is controlled to be 0.20 to 0.55 μm, preferably 0.20 to 0.42 μm, before the surface treatment. Such a copper foil is made by rolling with adjustment of the oil film equivalent of a rolling oil (high gloss rolling), chemical polishing such as chemical etching, or electrolytic polishing in a phosphoric acid solution. Since the TD surface roughness (Rz) and the glossiness of a copper foil are thus controlled to be in the range before the surface treatment, the surface roughness (Rz) and the surface area of the copper foil after the treatment can be easily controlled.

The copper foil before the surface treatment has a TD glossiness of 300 to 910% at 60 degrees, preferably 500 to 810%, more preferably 500 to 710%. In the case that a copper foil has an MD glossiness at 60 degrees less than 300% before the surface treatment, more defects in transparency of the resin may be caused compared with the case of 300% or more. In the case of more than 910%, a problem of difficulty in manufacturing may be caused.

The high gloss rolling may be performed with an oil film equivalent defined by the following expression of 13,000 to 24,000 or less:

Oil film equivalent={(rolling oil viscosity [cSt])×(sheet passage rate [mpm]+roll circumferential rate [mpm])}/{(roll biting angle [rad])×(material yield stress [kg/mm²])}

The rolling oil viscosity [cSt] is kinetic viscosity at 40° C.

In order to control the oil film equivalent to be 13,000 to 24,000, a known method may be used such as use of a low-viscosity rolling oil or slowing down of sheet passage rate.

Chemical polishing is performed with an etching solution of sulfuric acid-hydrogen peroxide-water or ammonia-hydrogen peroxide-water with a concentration lower than normal, for an extended period of time.

(Brightness Curve)

A polyimide having a ΔB (PI), which is defined in the following, of 50 or more and 65 or less before being laminated to a copper foil is laminated on the surface treated surface of the surface treated copper foil of the present invention. The copper foil is then photographed through the polyimide with a CCD camera. The brightness of the photographed image is measured for the respective observation spots along the direction perpendicular to the extending direction of the observed copper foil, so that an observation spot versus brightness graph is made. The brightness curve extending from an edge of the copper foil to a portion without the copper foil has top average Bt and bottom average Bb, with difference ΔB (ΔB=Bt−Bb). The surface treated copper foil of the present invention has a ΔB of 40 or more.

In the observation spot versus brightness graph, Sv defined by the following expression (1) is preferably 3.0 or more, wherein t1 represents a value pointing the position of the intersection closest to the copper foil among the intersections of the brightness curve and Bt, and t2 represents a value pointing the position of the intersection closest to the copper foil among the intersections of the brightness curve and 0.1ΔB in the range from the intersections of the brightness curve and Bt to a depth of 0.1 ΔB with Bt as reference:

$$Sv=(\Delta B \times 0.1)/(t1-t2) \quad (1)$$

With reference to drawing, "top average Bt of brightness curve," "bottom average Bb of brightness curve," and the following "t1," "t2," and "Sv" are described below.

In FIG. 1(a) and FIG. 1(b), schematic diagrams for defining Bt and Bb are shown for a copper foil having a width of approximately 0.3 mm. In the case of a copper foil having a width of approximately 0.3 mm, the brightness curve may be in a V-shape as shown in FIG. 1(a), or may be in a bottomed shape as shown in FIG. 1(b). In both instances, "top average Bt of brightness curve" represents the average of brightness measured at 5 spots at intervals of 30 μm from a position 50 μm away from the end position of both sides of a copper foil (total 10 spots on both sides). On the other hand, "bottom average Bb of brightness curve" represents the lowest value of the brightness at the tip of the V-shaped valley for the brightness curve in a V-shape as shown in FIG. 1(a), and the value of the central part of the approximately 0.3 mm-width for the brightness curve in a bottomed shape as shown in FIG. 1(b). A mark may have a width of about 0.2 mm, 0.16 mm, or 0.1 mm. Alternatively, "top average Bt of brightness curve" may represent the average of brightness measured at 5 spots at intervals of 30 μm from a position 100 μm away, a position 300 μm away, or a position 500 μm away from the end position of both sides of the mark (total 10 spots on both sides).

Figure 2:
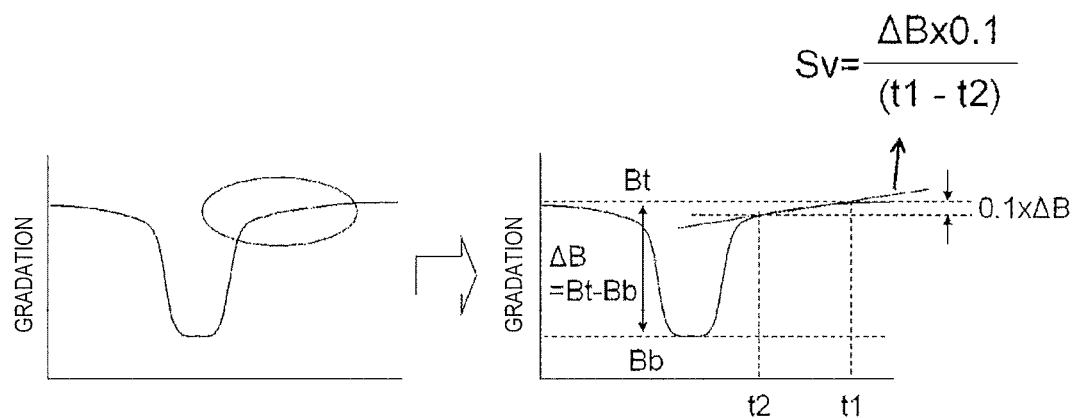
FIG. 2 is a schematic diagram for defining t1, t2, and Sv.

In FIG. 2, a schematic diagram for defining t1, t2, and Sv is shown. The term "t1 (pixel×0.1)" represents the intersection closest to the copper foil among the intersections of the brightness curve and Bt. The term "t2 (pixel×0.1)" represents the intersection closest to the copper foil among the intersections of the brightness curve and 0.1ΔB in the range from the intersections of the brightness curve and Bt to a depth of 0.1 ΔB with Bt as reference. On this occasion, the gradient of the brightness curve represented by the line connecting t1 and t2 is defined by Sv (gradation/pixel×0.1) calculated from 0.1ΔB in y-axis direction and (t1−t2) in x-axis direction. One pixel in the transverse axis corresponds to a length of 10 μm. Sv represents the smaller value obtained by measurement on both sides of a copper foil. In the case that a plurality of "intersections of the brightness curve and Bt" are present due to instability of the shape of the brightness curve, the intersection closest to the copper foil is employed.

In the image photographed by a CCD camera, a portion having no copper foil has high brightness, while the brightness sharply falls down at the edge of a copper foil. With good visibility through the polyimide substrate, the falling state of brightness can be clearly observed. On the other hand, with poor visibility through the polyimide substrate, the brightness does not drastically fall down from "high" to "low" at the vicinity of the edge of a copper foil, so that the gradual falling state results in the unclear falling state of brightness.

Based on such findings, a polyimide having a ΔB (PI), which is defined in the following, of 50 or more and 65 or less before being laminated to a copper foil is laminated on the surface treated surface. The copper foil is then photographed through the polyimide with a CCD camera. The brightness of the photographed image is measured for the respective observation spots along the direction perpendicular to the extending direction of the observed copper foil, so that an observation spot versus brightness graph is made. The brightness curve extending from an edge of the copper foil to a portion without the copper foil has top average Bt and bottom average Bb, with difference ΔB (ΔB=Bt−Bb). The surface treated copper foil of the present invention is controlled to have a ΔB of 40 or more. Alternatively the Sv of the surface treated copper foil of the present invention is controlled to be 3.0 or more.

Such a configuration allows the discrimination of a copper foil through polyimide with a CCD camera to be improved without influence of the type and the thickness of a substrate resin. Excellent visibility is thus achieved when observation is made through the polyimide resin. Consequently positioning accuracy in copper foil marking or the like is improved in a predetermined processing of a polyimide substrate in a step for manufacturing an electronic substrate or the like. The effects such as improved yields are thus obtained.

In the present invention, Sv is preferably 3.5 or more, more preferably 3.9 or more, more preferably 4.5 or more, more preferably 5.0 or more, and more preferably 5.5 or more. Although it is not needed to specify the upper limit of Sv, which may be, for example, 15 or less, or 10 or less. Such a configuration allows for a clearer boundary between a copper foil and a portion other than a copper foil, improving positioning accuracy with less error in copper foil image recognition. More accurate alignment is thus achieved.

Meanwhile, after lamination of surface treated copper foils on both surfaces of a polyimide, both of the surface copper foils may be removed by etching so as to form a copper foil in a circuit form on one surface only. In the case that excellent visibility of the copper foil in a circuit form is achieved by the observation through the polyimide, such a surface treated copper foil has excellent visibility by the observation through a polyimide after lamination to a polyimide.

(Surface Area Ratio)

The ratio A/B of the three dimensional surface area A on the side of the surface treated surface of a copper foil to the two dimensional surface area B greatly affects the transparency of the above-mentioned resin. Namely, for the same surface roughness Rz, the smaller the ratio A/B of a copper foil, the better transparency of the resin is achieved. Consequently, the ratio A/B of the surface treated copper foil of the present invention is preferably 1.0 to 1.7, more preferably 1.0 to 1.6. In the specification, the ratio A/B of the three dimensional surface area A of roughened grains on the side of the surface treated surface to the two dimensional surface area B can be, for example, in the case of roughening treated surface, the ratio A/B of the surface area A of roughened particles to the area B of the copper foil shown in the plan view from the copper foil surface side.

The morphology and the packing density of grains and the surface state such as surface irregularities are determined by control of the current density and plating time during surface treatment such as particle formation, so that the surface roughness Rz, the glossiness, and the surface area ratio A/B of a copper foil surface can be controlled.

The surface treated copper foil of the present invention can be laminated to an insulating resin substrate from the surface treated side so as to manufacture a laminate. The insulating resin substrate is not specifically limited so long as having characteristics applicable to a printed wiring board or the like. For example, a paper base phenolic resin, a paper base epoxy resin, a synthetic fiber fabric base epoxy resin, a glass fabric and paper composite base epoxy resin, a glass fabric and glass nonwoven fabric composite base epoxy resin, or a glass fabric base epoxy resin can be used for a rigid PWB, while a polyester film, a polyimide film, a liquid crystal polymer (LCP) film, or a TEFLON (registered trademark) film can be used for an FPC.

In the lamination method for a rigid PWB, a prepreg is prepared by impregnating a substrate such as glass fabric with a resin and curing the resin into a semi-cured state. A copper foil is superimposed on the prepreg so as to be hot pressed from the side opposite to the coating layer. A laminate for an FPC can be manufactured by laminating and bonding a copper foil to a substrate such as a polyimide film through an adhesive or without an adhesive under high temperature and high pressure, or by the steps of applying, drying, and curing a polyimide precursor.

The thickness of a polyimide substrate resin is not specifically limited. For example, the thickness may be typically 25 µm or 50 µm.

The laminate of the present invention can be used for various kinds of printed wiring boards (PWB), and the use is not specifically limited. For example, in the view of the number of layers with a conductor pattern, the laminate can be used for a single-sided PWB, a double-sided PWB, and a multi-layer PWB (3-layer or more). In the view of the type of insulating substrate material, the laminate can be used for a rigid PWB, a flexible PWB (FPC), and a rigid flex PWB. An electronic apparatus of the present invention can be made with such a printed wiring board.

The printed wiring board of the present invention includes an insulating resin substrate and a copper circuit arranged on the insulating resin substrate. The surface of the copper circuit has a color difference ΔE*ab of 50 or more based on JIS Z 8730 through the insulating resin substrate. The brightness of the image of the copper circuit photographed through the insulating resin substrate with a CCD camera is measured for the respective observation spots along the direction perpendicular to the extending direction of the observed copper circuit, so that an observation spot versus brightness graph is made. The brightness curve extending from an edge of the copper circuit to a portion without the copper circuit has top average Bt and bottom average Bb, with difference ΔB (ΔB=Bt−Bb). The printed wiring board of the present invention has a ΔB of 40 or more. Use of such a printed wiring board allows for more accurate positioning of the printed wiring board.

The printed wiring board of the present invention includes an insulating resin substrate and a copper circuit arranged on the insulating resin substrate. The surface of the copper circuit has a color difference ΔE*ab of 50 or more based on JIS Z 8730 through the insulating resin substrate. The brightness of the image of the copper circuit photographed through the insulating resin substrate with a CCD camera is measured for the respective observation spots along the direction perpendicular to the extending direction of the observed copper circuit, so that an observation spot versus brightness graph is made. The brightness curve extending from an edge of the copper circuit to a portion without the copper circuit has top average Bt and bottom average Bb, with difference ΔB (ΔB=Bt−Bb). In the observation spot versus brightness graph, Sv defined by the following expression (1) is 3.0 or more, wherein t1 represents a value pointing the position of the intersection closest to the copper circuit among the intersections of the brightness curve and Bt, and t2 represents a value pointing the position of the intersection closest to the copper circuit among the intersections of the brightness curve and 0.1ΔB in the range from the intersections of the brightness curve and Bt to a depth of 0.1 ΔB with Bt as reference:

$$Sv=(\Delta B \times 0.1)/(t1-t2) \qquad (1)$$

Use of such a printed wiring board allows for more accurate positioning of the printed wiring board.

The copper clad laminate of the present invention includes an insulating resin substrate and a copper foil arranged on the insulating resin substrate. The surface of the copper foil has a color difference ΔE*ab of 50 or more based on JIS Z 8730 through the insulating resin substrate. The brightness of the image of the copper foil of the copper clad laminate after being etched into a linear copper foil photographed through the insulating resin substrate with a CCD camera is measured for the respective observation spots along the direction perpendicular to the extending direction of the observed linear copper foil, so that an observation spot versus brightness graph is made. The brightness curve extending from an edge of the linear copper foil to a portion without the linear copper foil has top average Bt and bottom average Bb, with a difference ΔB (ΔB=Bt−Bb) of 40 or more. Use of such a copper clad laminate in manufacturing of a printed wiring board allows for more accurate positioning of the printed wiring board.

The copper clad laminate of the present invention includes a copper clad laminate having an insulating resin substrate and a copper foil arranged on the insulating resin substrate. The surface of the copper foil has a color difference ΔE*ab of 50 or more based on JIS Z 8730 through the insulating resin substrate. The brightness of the image of the copper foil of the copper clad laminate after being etched into a linear copper foil photographed through the insulating resin substrate with a CCD camera is measured for the respective observation spots along the direction perpendicular to the extending direction of the observed linear copper foil, so that an observation spot versus brightness graph is made. The brightness curve extending from an edge of the linear copper foil to a portion without the linear copper foil has top average Bt and bottom average Bb, with difference ΔB (ΔB=Bt−Bb). In the observation spot versus brightness graph, Sv defined by the following expression (1) is 3.0 or more, wherein t1 represents a value pointing the position of the intersection closest to the linear copper foil among the intersections of the brightness curve and Bt, and t2 represents a value pointing the position of the intersection closest to the linear copper foil among the intersections of the brightness curve and 0.1ΔB in the range from the intersections of the brightness curve and Bt to a depth of 0.1ΔB with Bt as reference:

$$Sv = (\Delta B \times 0.1)/(t1-t2) \quad (1)$$

Use of such a copper clad laminate in manufacturing of a printed wiring board allows for more accurate positioning of the printed wiring board.

(Laminate and Positioning Method of Printed Wiring Board Using the Laminate)

The positioning method of a laminate of metal and resin of the present invention is described below. First, a laminate of metal and resin is prepared. The form of a laminate of metal and resin is not specifically limited so long as a metal is laminated to a resin. Specific examples of the laminate of metal and resin of the present invention include a laminate for an electronic apparatus including a main body substrate, an auxiliary circuit substrate, and a flexible printed substrate for electrically connecting the above-mentioned substrates, formed of a resin such as polyimide of which at least one surface is provided with a wiring of metal such as copper. The flexible printed substrate is accurately positioned so as to be pressure bonded to the wiring terminals of the main body substrate and the auxiliary circuit substrate. In this case, the laminate is composed of a flexible printed substrate and a main body substrate of which wiring terminals are pressure bonded for lamination, or composed of a flexible printed substrate and a circuit substrate of which wiring terminals are pressure bonded for lamination. The laminate includes a mark formed of a part of the metal wiring or another material. The position of the mark is not specifically limited so long as the position allows for photographing with photographing means such as a CCD camera through the resin for constituting the laminate.

The mark of the laminate thus prepared is photographed with photographing means through the resin. The brightness of the photographed image of the mark is measured for the respective observation spots along the direction perpendicular to the extending direction of the observed mark, so that an observation spot versus brightness graph is made. The brightness curve extending from an edge of the mark to a portion without the mark has top average Bt and bottom average Bb, with difference ΔB (ΔB=Bt−Bb), which is used for the detection of the position of the mark. The positioning of the laminate of metal and resin is performed based on the detected position of the mark.

On this occasion, the position of the mark may be detected using the Sv value only, so that the positioning of the laminate of metal and resin is performed based on the detected position of the mark, or the position of the mark may be detected using both of the ΔB value and the Sv value, so that the positioning of the laminate of metal and resin is performed based on the detected position of the mark.

Such a positioning method allows for a clearer boundary between the mark and a portion other than the mark, improving positioning accuracy with less error in mark image recognition. More accurate alignment is thus achieved. For example, a position detecting device can determine that the mark is at the position for a ΔB value, an Sv value, or both of a ΔB value and a Sv value of predetermined values or more. More specifically, a position detecting device can determine that the mark is at the position, for example, for a ΔB value of 40 or more when based on ΔB value only, for an Sv value of 3.0 or more when based on Sv value only, or for a ΔB value of 40 or more and an Sv value of 3.0 or more when based on ΔB value and Sv value. Use of such a positioning method allows for more accurate positioning of the printed wiring board.

Consequently defects in connection are decreased when a printed wiring board is connected to another printed wiring board, so that yield can be increased. On this occasion, the copper foil may be a surface treated copper foil. Examples of the method for connecting a printed wiring board to another printed wiring board include known connecting method such as soldering, connection through an anisotropic conductive film (ACF), connection through an anisotropic conductive paste (ACP), and connection through a conductive adhesive. In the present invention, "a printed wiring board" includes a printed wiring board mounted with components, a printed circuit board, and a printed board. Two or more printed wiring boards of the present invention can be connected so that a printed wiring board including two or more printed wiring boards connected to each other can be manufactured. At least one printed wiring board of the present invention and another printed wiring board of the present invention or a printed wiring board other than the printed wiring board of the present invention can be connected to each other. An electronic apparatus may be manufactured using such a printed wiring board. In the present invention, "a copper circuit" includes a copper wiring.

The positioning method according to an embodiment of the present invention may include a step of transferring a laminate (including a laminate of copper and resin and a printed wiring board). In the step of transferring, transferring may be performed, for example, with a conveyor such as a belt conveyor and a chain conveyor, with a transferring device having an arm mechanism, with a transferring device or transferring means for transferring a laminate floated by a gas, with a transferring device or transferring means for transferring a laminate through rotation of approximately cylindrical matters (including rollers and bearings), with a transferring device or transferring means having a hydraulic power source, with a transferring device or transferring means having a pneumatic power source, with a transferring device or transferring means having a motor power source, or with a transferring device or transferring means having a stage such as a gantry moving type linear guide stage, a gantry moving type air guide stage, a stack type linear guide stage, and a linear motor driven stage. Alternatively the transferring step may be performed with known transferring means.

The positioning method according to an embodiment of the present invention may be used in a surface mounting machine and a chip mounter.

The laminate of metal and resin to be positioned in the present invention may be a printed wiring board having a resin board and a circuit arranged on the resin board. In this case, the mark may be the above-mentioned circuit.

In the present invention, "positioning" includes "detecting the position of a mark or an object." In the present invention, "alignment" includes "transferring the mark or the object to a predetermined position on the basis of the detected position after detection of the position of the mark or the object."

[Examples]

In Examples 1 to 9 and Comparative Examples 1 to 4, a copper foil was prepared for each. Each one surface was subject to a plating treatment as roughening treatment under the conditions described in Table 2 and Table 3.

A rolled copper foil was manufactured as follows. A prescribed copper ingot was manufactured to be hot rolled. Subsequently, annealing in a continuous annealing line at 300 to 800° C. and cold rolling were repeated such that a rolled sheet with a thickness of 1 to 2 mm was produced. The rolled sheet was annealed in a continuous annealing line at 300 to 800° C. so as to be recrystallized and finally cold rolled into a copper foil having a thickness described in Table 1. In Table 1, "tough pitch copper" represents a tough pitch copper in accordance with the standard JIS H 3100 and JIS C 1100. In Table 1, "oxygen-free copper" represents an oxygen-free copper in accordance with the standard JIS H 3100 and JIS C 1020. In Table 1, "ppm" of additive element represents mass ppm. In Table 1, for example, "tough pitch copper+Ag 180 ppm" described in the column of type of metal foil (before surface treatment) means that 180 mass ppm of Ag was added to tough pitch copper.

An electrolyte copper foil was made under the following conditions:

Electrolyte composition (copper: 100 g/L, sulfuric acid: 100 g/L, chlorine: 50 ppm, leveling agent 1 (bis(3-sulfopropyl)disulfide): 10 to 30 ppm; and leveling agent 2 (amine compound): 10 to 30 ppm);

Electrolyte temperature: 50 to 60° C.;
Current density: 70 to 100 A/dm$^2$;
Electrolysis time: 1 min; and
Linear velocity of electrolyte: 4 m/sec.

The amine compound represented by the following formula was used as the above-mentioned amine compound.

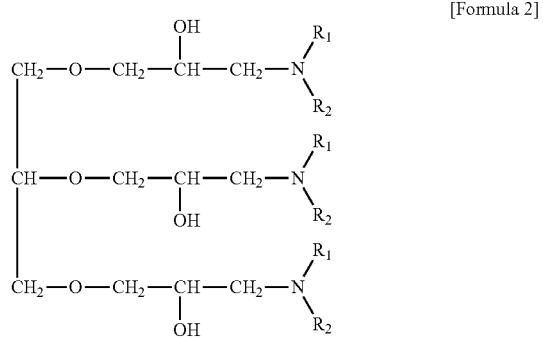

[Formula 2]

(In the chemical formula, $R_1$ and $R_2$ are selected from the group consisting of a hydroxyalkyl group, an ether group, an aryl group, an aromatic substituted alkyl group, an unsaturated hydrocarbon group, and an alkyl group.)

In Table 1, the key spots in the step of manufacturing a copper foil before surface treatment are described. "High gloss rolling" means that the final cold rolling (cold rolling after final recrystallization annealing) was performed at the described oil film equivalent.

Various evaluations of each sample thus made in Examples and Comparative Examples were performed as follows.

(1) Measurement of Surface Roughness (Rz)

With regard to the surface treated copper foil in Examples and Comparative Examples, the ten-spot average roughness of the surface treated surface was measured in accordance with JIS B 0601-1994 with a contact roughness meter Surfcorder SE-3C made by Kosaka Laboratory Ltd. The measurement was performed under the following conditions: measurement reference length: 0.8 mm; evaluation length: 4 mm; cutoff value: 0.25 mm; and feed rate: 0.1 mm/s. The measurement position of a rolled copper foil was changed in the perpendicular direction (TD) to the rolling direction, and the measurement position of an electrolyte copper foil was changed in the perpendicular direction (TD) to the movement direction of the electrolyte copper foil in the manufacturing device of the electrolyte copper foil, such that the measurement was performed 10 times, respectively. The value was obtained from the ten times measurement.

The surface roughness (Rz) of the copper foil before surface treatment was also obtained in the same way, in advance.

(2) Measurement of Color Difference ΔE*Ab Through Polyimide

The color difference ΔE*ab based on JIS Z 8730 of the surface of a copper clad laminate including a lamination of a surface treated copper foil and a polyimide film (made by Kaneka Corporation, thickness: 25 μm or 50 μm) having a ΔB (PI) of 50 or more and 65 or less before being laminated to the copper foil was measured through the polyimide film. The measurement of the color difference ΔE*ab was performed in accordance with JIS Z 8730 with a color difference meter MiniScan XE Plus made by HunterLab Inc. In the measurement by the color difference meter, the measurement value of a white plate is set to ΔE*ab=0, and the measurement value in the dark, covered with a black bag, is set to ΔE*ab=90, for the calibration of a color difference. The ΔE*ab was measured based on the following expression, by using the L*a*b colorimetric system with ΔL: white and black, Δa: red and green, and Δb: yellow and blue, wherein the color difference ΔE*ab is defined as zero for white color and 90 for black color.

$$\Delta E^*ab = \Delta\sqrt{\Delta L^2 + \Delta a^2 + \Delta b^2}$$ [Expression 2]

The color difference ΔE*ab based on JIS Z 8730 of the surface of a copper circuit may be measured with a known measuring device such as a microscopic area spectroscopic color difference meter made by Nippon Denshoku Industries Co., Ltd. (Model: VSS400 and the like) or a microscopic area spectroscopic colorimeter made by Suga Test Instruments Co., Ltd (Model: SC-50μ and the like).

(3) Surface Area Ratio of Copper Foil (A/B)

The surface area of a copper foil was measured with a laser microscope. The three-dimensional surface area A for an equivalent area B of 647 μm×646 μm (417,953 μm$^2$ in actual data) of the surface treated surface of a copper foil in each of Examples and Comparative Examples after surface treatment was measured with a laser microscope OLS4000 made by Olympus Corporation with a magnifying power of 20. The ratio was obtained by the following expression: (three-dimensional surface area A)÷(two-dimensional surface area B)=area ratio (A/B). The three-dimensional surface area A was measured with the laser microscope at an environment temperature of 23 to 25° C.

(4) Glossiness

The measurement was performed with a gloss meter, Handy Gloss Meter PG-1 made by Nippon Denshoku Industries Co., Ltd., in accordance with JIS Z 8741. With regard to a rolled copper foil, the surface before surface treatment was measured in the perpendicular direction (TD) to the rolling direction (movement direction of the copper foil during rolling, i.e., width direction) at an incident angle of 60 degrees. With regard to an electrolyte copper foil, the surface before surface treatment (mat surface) was measured in the perpendicular direction (i.e., width direction) (TD) to the transportation direction of the copper foil during electrolytic treatment at an incident angle of 60 degrees.

(5) Gradient of Brightness Curve

Figure 3:
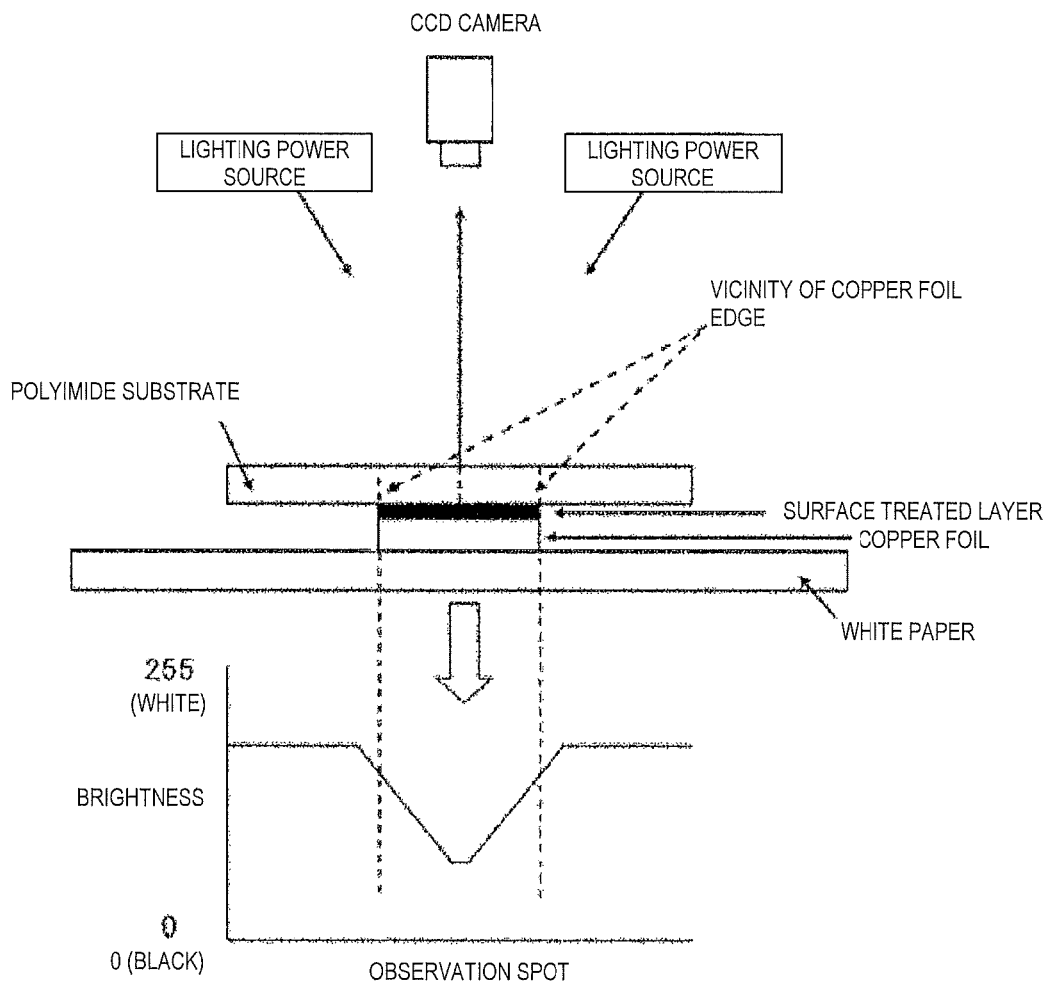
FIG. 3 is a schematic diagram illustrating the constitution of a photographic device and a method for measuring the gradient of a brightness curve for evaluation of the gradient of the brightness curve.

The surface treated side of a manufactured copper foil was faced to a polyimide film so as to be laminated on both sides of the polyimide film (made by Kaneka Corporation, thickness: 25 μm or 50 μm). The whole of the copper foil on one side was removed by etching. The copper foil on another side was etched into a linear form having a width of 0.3 mm. Subsequently, a sheet of white paper was laid on the back face of the linear copper foil having a width of 0.3 mm. The copper foil was photographed with a CCD camera (a line CCD camera with 8,192 pixels) through the polyimide film. The brightness of the photographed image was measured for the respective observation spots along the direction perpendicular to the extending direction of the observed copper foil, so that an observation spot versus brightness graph was made. From the brightness curve extending from an edge of the mark to a portion without the mark, ΔB, t1, t2, and Sv were measured. A schematic diagram illustrating the constitution of a photographic device and a method for measuring the brightness curve for use in the measurement are shown in FIG. 3. The polyimide having a thickness of 25 μm or 50 μm for use in the evaluation of the gradient of a brightness curve had a ΔB (PI) of 50 or more and 65 or less before being laminated to a copper foil. In measurement of ΔB (PI) of the polyimide before being laminated to the copper foil, a sheet of white paper printed with a black mark in a linear shape having a width of 0.3 mm (a printed matter with a linear black mark) was used instead of a copper foil in a linear shape having a width of 0.3 mm.

The ΔB, t1, t2, and Sv were measured with the following photographing device. One pixel in the transverse axis corresponds to a length of 10 μm.

A white gloss paper having a glossiness of 43.0±2 was used as the "white paper" laid on the "back face of a linear copper foil having a width of 0.3 mm."

Figure 5:
FIG. 5 is a photograph of the external appearance of dirt for use in an Example.

A transparent film printed with various kinds of lines or the like as shown in FIG. 5 as dirt (made by Choyokai Co., Ltd., product name: "dirt measuring chart, full size version," product number: JQA160-20151-1 (made by National Printing Bureau, Independent Administrative Agency)), which is adopted in both of JIS P 8208 (1998) (FIG. 1: copy of dirt measuring chart) and JIS P 8145 (2011) (appendix JA (standard): dirt comparison chart for visual observation method, and Figure JA. 1: copy of dirt comparison chart for visual observation method), was placed on a sheet of white gloss paper having a glossiness of 43.0±2, for use as the "printed matter with a linear black mark".

The glossiness of the gloss paper was measured with a gloss meter, Handy Gloss Meter PG-1 made by Nippon Denshoku Industries Co., Ltd., in accordance with JIS Z 8741 at an incident angle of 60 degrees.

The photographing device includes a CCD camera, a sheet of white paper on which a polyimide substrate laminated with a sample copper foil is placed (the polyimide substrate laminated with a copper foil is placed such that the surface opposite to the surface having the linear copper foil faces the CCD camera), a lighting power source which allows the photographed part of the polyimide substrate to be irradiated with light, and a transporting machine (not shown in drawing) which transports the copper foil and the polyimide substrate to be photographed onto a stage. The main specifications of the photographing device are as follows:

Photographing device: sheet inspection device Mujiken made by Nireco Corporation;

Line CCD camera: 8,192 pixels (160 MHz), 1,024 gradation digital (10-bit);

Lighting power source: high frequency lighting source (power unit×2); and

Lighting: fluorescent lamp (30 W, model name: FPL27EX-D, twin fluorescent lamp).

A line drawn in the dirt in FIG. 5 indicated by arrow was used as the line for measuring ΔB (PI), having 0.7 mm². The line has a width of 0.3 mm. The viewing field of the line CCD camera was arranged as shown by dotted lines in FIG. 5.

In photographing by a line CCD camera, signals were confirmed in a full scale with 256 gradations, and the lens aperture was adjusted such that the peak gradation signal of the spot where no black mark of a printed matter is present is controlled to be within 230±5 (when the transparent film was placed on the white gloss paper such that the spot other than the printed mark on the dirt was measured with a CCD camera from the transparent film side) in a state that no polyimide film (polyimide substrate) to be measured was placed. The scanning time of the camera (time period when the shutter of a camera is open, i.e., time period for taking light in) was fixed at 250 μs, and the aperture of a lens was adjusted to be within the gradations.

With regard to the brightness shown in FIG. 3, zero means "black," and a brightness of 255 means "white." The degree of gray color from "black" to "white" (density of black and white, i.e., gray scale) is thus segmented into 256 gradations for representation.

(6) Visibility (Transparency of Resin)

A copper foil was laminated on each of both sides of a polyimide film (made by Kaneka Corporation, thickness: 25 μm or 50 μm), and the copper foil was removed by etching (ferric chloride aqueous solution) so as to form a sample film. A printed matter (a black circle with a diameter of 6 cm) was attached to one surface of the produced resin layer, and the visibility of the printed matter was determined through the resin layer from the opposite surface. In the evaluation, a sample having a clear contour of the black circle for 90% or more of the circumference length was ranked as "excellent: ⊚," a sample having a clear contour of the black circle for 80% or more and less than 90% of the circumference length was ranked "good: ○" (the above were rated acceptable), and a sample having a clear contour of the black circle for 0 to less than 80% of the circumference length or having a broken contour was ranked "poor: x" (unacceptable).

(7) Peel Strength (Adhesion Strength)

In accordance with PC-TM-650, the normal peel strength was measured with a tension testing machine Autograph 100. A sample having a normal peel strength of 0.7 N/mm or higher was determined to be applicable for use in a laminated substrate. In the measurement of peel strength, the thickness of a copper foil was set to 18 μm. A copper foil having a thickness less than 18 μm was copper plated to have a copper foil thickness of 18 μm. A copper foil having a thickness more than 18 μm was etched to have a copper foil thickness of 18 μm.

(8) Yield

A copper foil was laminated on each of both sides of a polyimide film (made by Kaneka Corporation, thickness: 25 μm or 50 μm), and the copper foil was etched (ferric chloride aqueous solution) so as to form an FPC having a circuit width with an L/S of 30 μm/30 μm. Subsequently the detection of a 20 μm×20 μm square mark was tried through polyimide with a CCD camera. A mark detectable 9 times or more out of 10 times was rated as "excellent: ⊚," a mark detectable 7 to 8 times was rated as "good: ○," a mark detectable 6 times was rated as "fair: Δ," and a mark detectable 5 times or less was rated as "poor: x."

With regard to a printed wiring board or a copper clad laminate, the resin can be melted and removed for the measurement of the above-mentioned (1) surface roughness (Rz) and (3) surface area ratio of copper foil (A/B) of the copper circuit or the copper foil surface.

The conditions and the evaluation of the respective tests are described in Tables 1 to 3.

TABLE 1

Metal foil (before surface treatment)

|  | Type | Process | Thickness | Roughness TD Rz (μm) | Glossiness TD (%) |
|---|---|---|---|---|---|
| Example 1 | Tough pitch copper | High gloss rolling, oil film equivalent 24,000 | 5 um | 0.50 | 420 |
| Example 2 | Oxygen free copper + Ag 10 ppm | High gloss rolling, oil film equivalent 17,000 | 18 um | 0.40 | 505 |
| Example 3 | Oxygen free copper + Sn 70 ppm + B 100 ppm | High gloss rolling, oil film equivalent 17,000 | 70 um | 0.40 | 505 |
| Example 4 | Tough pitch copper + Zn 200 ppm + Ni 200 ppm + Cr 50 ppm | High gloss rolling, oil film equivalent 17,000 | 12 um | 0.40 | 505 |
| Example 5 | Oxygen free copper + Sn 2500 ppm | High gloss rolling, oil film equivalent 17,000 | 9 um | 0.40 | 505 |
| Example 6 | Tough pitch copper + Ag 180 ppm | High gloss rolling, oil film equivalent 14,000 | 35 um | 0.35 | 610 |
| Example 7 | Tough pitch copper + Ag 180 ppm | High gloss rolling, oil film equivalent 17,000 | 18 um | 0.38 | 520 |
| Example 8 | Electrolyte copper foil | Electrolyte copper foil | 18 um | 0.55 | 520 |
| Example 9 | Tough pitch copper | High gloss rolling, oil film equivalent 17,000 | 18 um | 0.40 | 505 |
| Comparative Example 1 | Tough pitch copper | Normal rolling, oil film equivalent 25,000 | 18 um | 0.70 | 192 |
| Comparative Example 2 | Tough pitch copper | High gloss rolling, oil film equivalent 17,000 | 18 um | 0.40 | 505 |
| Comparative Example 3 | Tough pitch copper | High gloss rolling, oil film equivalent 17,000 | 18 um | 0.40 | 505 |
| Comparative Example 4 | Tough pitch copper + Ag 180 pm | High gloss rolling, oil film equivalent 17,000 | 18 um | 0.38 | 520 |

TABLE 2

|  | Surface treatment | | | | | | | | | | | |
|---|---|---|---|---|---|---|---|---|---|---|---|---|
|  | Plating bath (Table 3) | Current density (A/dm$^2$) | Plating time (sec) | Roughness TD Rz (μm) | Surface area ratio A/B | Resin thickness (μm) | ΔE*ab (through polyimide) | ΔB | Sv | Peel strength (N/mm) | Visibility | Yield |
| Example 1 | (1) | 43 | 1.0 | 0.54 | 1.56 | 50 | 64 | 55 | 3.0 | 1.50 | Good ○ | Fair △ |
| Example 2 | (1) | 35 | 1.0 | 0.35 | 1.25 | 50 | 51 | 40 | 3.5 | 0.74 | Good ○ | Good ○ |
| Example 3 | (1) | 37 | 1.0 | 0.42 | 1.35 | 50 | 53 | 55 | 4.7 | 1.35 | Excellent ◎ | Excellent ◎ |
| Example 4 | (1) | 40 | 1.0 | 0.46 | 1.43 | 50 | 64 | 52 | 5.2 | 1.45 | Excellent ◎ | Excellent ◎ |
| Example 5 | (1) | 45 | 1.0 | 0.47 | 1.68 | 50 | 65 | 55 | 6.0 | 1.55 | Excellent ◎ | Excellent ◎ |
| Example 6 | (1) | 45 | 1.0 | 0.42 | 1.44 | 25 | 63 | 63 | 6.4 | 1.45 | Excellent ◎ | Excellent ◎ |
| Example 7 | (2) | 35 | 1.3 | 0.53 | 1.20 | 50 | 70 | 45 | 3.7 | 1.70 | Excellent ◎ | Excellent ◎ |
| Example 8 | (2) | 30 | 0.8 | 0.58 | 1.51 | 25 | 64 | 55 | 4.0 | 1.80 | Excellent ◎ | Excellent ◎ |
| Example 9 | (3) | 2 | 20.0 | 0.50 | 1.53 | 50 | 71 | 42 | 3.8 | 1.10 | Excellent ◎ | Excellent ◎ |
| Comparative Example 1 | (1) | 35 | 2.0 | 0.78 | 1.78 | 25 | 73 | 37 | 2.5 | 1.40 | Poor X | Poor X |
| Comparative Example 2 | (1) | 35 | 0.5 | 0.41 | 1.17 | 50 | 48 | 43 | 3.3 | 0.65 | Poor X | Poor X |
| Comparative Example 3 | (4) | 1 | 2.0 | 0.40 | 1.10 | 50 | 32 | 55 | 2.9 | 0.74 | Poor X | Poor X |
| Comparative Example 4 | (5) | 55 | 1.0 | 1.00 | 1.80 | 25 | 55 | 25 | 1.4 | 1.80 | Poor X | Poor X |

TABLE 3

| Plating bath (1) | Plating bath (2) | Plating bath (3) | Plating bath (4) | Plating bath (5) |
|---|---|---|---|---|
| Cu 15 g/L | Cu 20 g/L | Ni 25 g/L | Zn 10 g/L | Cu 10 g/L |
| Co 8.5 g/L | Ni 5 g/L | W 20 mg/L | Ni 10 g/L | H$_2$SO$_4$ 50 g/L |
| Ni 8.6 g/L | P 1 g/L | pH 3.6 | pH 3.6 | Bath temperature 25° C. |
| pH 2.5 | pH 2.0 | Bath temperature 40° C. | Bath temperature 40° C. |  |
| Bath temperature 38° C. | Bath temperature 30° C. |  |  |  |

(Evaluation Results)

In Examples 1 to 9, any one of the samples had a color difference ΔE*ab through polyimide of 50 or more, and a ΔB of 40 or more, so that the visibility was excellent.

In Comparative Examples 1 to 4, the samples had a color difference ΔE*ab through polyimide of less than 50, or a ΔB of less than 40, so that the visibility was poor.

Figure 4A:
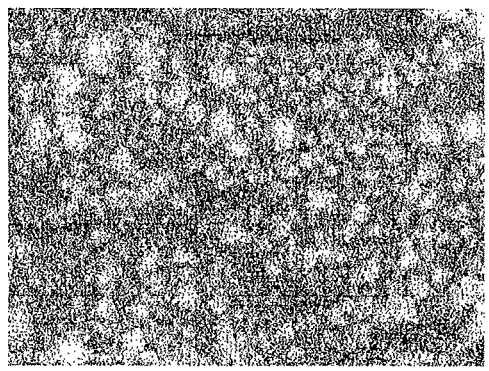
FIG. 4a is a SEM observation photograph of the copper foil surface in Comparative Example 1 for evaluating Rz.
Figure 4B:
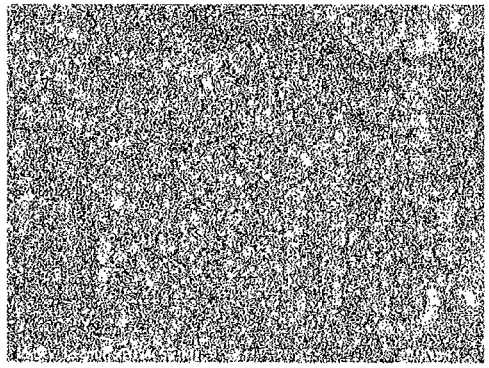
FIG. 4b is a SEM observation photograph of the copper foil surface in Example 1 for evaluating Rz.

The SEM observation photographs of the copper foil surface in Comparative Example 1 and Example 1 for the evaluation of Rz are shown in FIGS. 4(a) and 4(b), respectively.

Figure 6:
FIG. 6 is a photograph of the external appearance of dirt for use in an Example.

In Examples 1 to 9, the width of the linear copper foil mark having a width of 0.3 mm and the width of the dirt mark were changed from 0.3 mm to 0.16 mm (a mark arranged thirdly closer to the description 0.5 having an area of 0.5 mm$^2$ in the sheet of dirt (mark indicated by arrow in FIG. 6)) for the same measurement of ΔB (PI), Sv value, and ΔB value. As a result, the same values as for the mark having a width of 0.3 mm were obtained in any of the ΔB (PI), Sv value, and ΔB value.

Furthermore, in Examples 1 to 9, the "top average Bt of brightness curve" representing the average of brightness measured at 5 spots at intervals of 30 μm from a position 50 μm away from the end position of both sides of the mark (total 10 spots on both sides) was changed to the average of brightness measured at 5 spots at intervals of 30 μm from a position 100 μm away, from a position 300 μm away, and from a position 500 μm away, from the end position of both sides of the mark (total 10 spots on both sides), respectively for the same measurement of ΔB (PI), Sv value, and ΔB value. As a result, the same values as for the "top average Bt of brightness curve" representing the average of brightness measured at 5 spots at intervals of 30 μm from a position 50 μm away from the end position of both sides of the mark (total 10 spots on both sides) were obtained in any of the ΔB (PI), Sv value, and ΔB value.

The invention claimed is:

1. A surface treated copper foil to be laminated on a polyimide having a ΔB (PI) to be defined as follows of 50 or more and 65 or less before being laminated to the copper foil so as to form a copper clad laminate comprising:
   a surface having a color difference ΔE*ab of 50 or more based on JIS Z 8730 through the polyimide when the copper foil is laminated on the polyimide; and
   a difference between the top average Bt and the bottom average Bb in a brightness curve extending from an edge of the copper foil to a portion without the copper foil ΔB (ΔB=Bt−Bb) of 40 or more;
   wherein the brightness curve is obtained from an observation spot versus brightness graph of measurement results of the brightness of the photographed image of the copper foil through the polyimide when the copper foil is laminated on the polyimide from the surface treated surface side of the copper foil with a CCD camera for the respective observation spots along the direction perpendicular to the extending direction of the observed copper foil.

2. A surface treated copper foil to be laminated on a polyimide having a ΔB (PI) to be defined as follows of 50 or more and 65 or less before being laminated to the copper foil so as to form a copper clad laminate comprising:
   a surface having a color difference ΔE*ab of 50 or more based on JIS Z 8730 through the polyimide when the copper foil is laminated on the polyimide; and
   an Sv defined by the following expression (1) of 3.0 or more based on a brightness curve:

$$Sv = (\Delta B \times 0.1)/(t1-t2) \quad (1);$$

wherein the brightness curve is obtained from an observation spot versus brightness graph of measurement results of the brightness of the photographed image of the copper foil through the polyimide when the copper foil is laminated on the polyimide from the surface treated surface side of the copper foil with a CCD camera for the respective observation spots along the direction perpendicular to the extending direction of the observed copper foil, and the difference between the top average Bt and the bottom average Bb in the brightness curve extending from an edge of the copper foil to a portion without the copper foil is represented by AB (ΔB=Bt−Bb); and
   wherein t1 represents a value pointing the position of the intersection closest to the copper foil among the intersections of the brightness curve and Bt in the observation spot versus brightness graph, and t2 represents a value pointing the position of the intersection closest to the copper foil among the intersections of the brightness curve and 0.1ΔB in the range from the intersections of the brightness curve and Bt to a depth of 0.1ΔB with Bt as reference.

3. The surface treated copper foil according to claim 1, further comprising:
   an Sv defined by the following expression (1) of 3.0 or more:

$$Sv = (\Delta B \times 0.1)/(t1-t2) \quad (1);$$

wherein t1 represents a value pointing the position of the intersection closest to the copper foil among the intersections of the brightness curve and Bt in the observation spot versus brightness graph, and t2 represents a value pointing the position of the intersection closest to the copper foil among the intersections of the brightness curve and 0.1ΔB in the range from the intersections of the brightness curve and Bt to a depth of 0.1ΔB with Bt as reference.

4. The surface treated copper foil to be laminated on a polyimide having a ΔB (PI) to be defined as follows of 50 or more and 65 or less before being laminated to the copper foil so as to form a copper clad laminate according to claim 1, wherein the surface has a color difference ΔE*ab of 53 or more based on JIS Z 8730 through the polyimide.

5. The surface treated copper foil according to claim 2, wherein the Sv defined by the expression (1) in the brightness curve is 3.5 or more.

6. The surface treated copper foil according to claim 1, wherein the surface has a TD average roughness Rz of 0.20 to 0.64 μm, and the copper foil surface has a three-dimensional surface area A to two-dimensional surface area B ratio A/B of 1.0 to 1.7.

7. A laminate comprising the surface treated copper foil according to claim 1 and a resin substrate.

8. A printed wiring board comprising the surface treated copper foil according to claim 1.

9. An electronic apparatus comprising at least one of the printed wiring board according to claim 8.

10. A printed wiring board including an insulating resin substrate and a copper circuit arranged on the insulating resin substrate comprising:
    a surface of the copper circuit having a color difference ΔE*ab of 50 or more based on JIS Z 8730 through the insulating resin substrate; and
    a difference between the top average Bt and the bottom average Bb in a brightness curve extending from an edge of the copper circuit to a portion without the copper circuit ΔB (ΔB=Bt−Bb) of 40 or more;
    wherein the brightness curve is obtained from an observation spot versus brightness graph of measurement results of the brightness of the photographed image of the copper circuit through the insulating resin substrate with a CCD camera for the respective observation spots along the direction perpendicular to the extending direction of the observed copper circuit.

11. A copper clad laminate including an insulating resin substrate and a copper foil arranged on the insulating resin substrate comprising:
    a surface of the copper foil having a color difference ΔE*ab of 50 or more based on JIS Z 8730 through the insulating resin substrate; and
    a difference between the top average Bt and the bottom average Bb in a brightness curve extending from an edge of a linear copper foil to a portion without the linear copper foil ΔB (ΔB=Bt−Bb) of 40 or more;
    wherein the brightness curve is obtained from an observation spot versus brightness graph of measurement results of the brightness of the photographed image of the copper foil of the copper clad laminate after being etched into the linear copper foil through the insulating resin substrate with a CCD camera for the respective observation spots along the direction perpendicular to the extending direction of the observed linear copper foil.

12. A printed wiring board including an insulating resin substrate and a copper circuit arranged on the insulating resin substrate comprising:

a surface of the copper circuit having a color difference ΔE*ab of 50 or more based on JIS Z 8730 through the insulating resin substrate; and an Sv defined by the following expression (1) of 3.0 or more based on a brightness curve:

$$Sv=(\Delta B \times 0.1)/(t1-t2) \qquad (1);$$

wherein the brightness curve is obtained from an observation spot versus brightness graph of measurement results of the brightness of the photographed image of the copper circuit through the insulating resin substrate with a CCD camera for the respective observation spots along the direction perpendicular to the extending direction of the observed copper circuit, and the difference between the top average Bt and the bottom average Bb in the brightness curve extending from an edge of the copper circuit to a portion without the copper circuit is represented by AB (ΔB=Bt−Bb); and wherein t1 represents a value pointing the position of the intersection closest to the copper circuit among the intersections of the brightness curve and Bt in the observation spot versus brightness graph, and t2 represents a value pointing the position of the intersection closest to the copper circuit among the intersections of the brightness curve and 0.1ΔB in the range from the intersections of the brightness curve and Bt to a depth of 0.1ΔB with Bt as reference.

13. A copper clad laminate including an insulating resin substrate and a copper foil arranged on the insulating resin substrate comprising:

a surface of the copper foil having a color difference ΔE*ab of 50 or more based on JIS Z 8730 through the insulating resin substrate; and an Sv defined by the following expression (1) of 3.0 or more based on a brightness curve:

$$Sv=(\Delta B \times 0.1)/(t1-t2) \qquad (1);$$

wherein the brightness curve is obtained from an observation spot versus brightness graph of measurement results of the brightness of the photographed image of the copper foil of the copper clad laminate after being etched into a linear copper foil through the insulating resin substrate with a CCD camera for the respective observation spots along the direction perpendicular to the extending direction of the observed linear copper foil, and the difference between the top average Bt and the bottom average Bb in the brightness curve extending from an edge of the linear copper foil to a portion without the linear copper foil is represented by AB (ΔB=Bt−Bb); and wherein t1 represents a value pointing the position of the intersection closest to the linear copper foil among the intersections of the brightness curve and Bt in the observation spot versus brightness graph, and t2 represents a value pointing the position of the intersection closest to the linear copper foil among the intersections of the brightness curve and 0.1ΔB in the range from the intersections of the brightness curve and Bt to a depth of 0.1ΔB with Bt as reference.

14. A method for manufacturing a printed wiring board having two or more connected printed wiring boards comprising at least the step of connecting at least one printed wiring board according to claim 10 to another printed wiring board according to claim 10 or to a printed wiring board other than the printed wiring board according to claim 10.

15. An electronic apparatus comprising at least one printed wiring board connected to at least one printed wiring board according to claim 10.

16. A method for manufacturing a printed wiring board having two or more connected printed wiring boards comprising at least the step of connecting at least one printed wiring board according to claim 12 to another printed wiring board according to claim 12 or to a printed wiring board other than the printed wiring board according to claim 12.

17. An electronic apparatus comprising at least one printed wiring board connected to at least one printed wiring board according to claim 12.

18. The surface treated copper foil according to claim 1, wherein the surface has a TD average roughness Rz of 0.26 μm to 0.62 μm.

19. The surface treated copper foil according to claim 1, wherein the surface has a TD average roughness Rz of 0.40 μm to 0.55 μm.

20. The surface treated copper foil to be laminated on a polyimide having a ΔB (PI) to be defined as follows of 50 or more and 65 or less before being laminated to the copper foil so as to form a copper clad laminate according to claim 2, wherein the surface has a color difference ΔE*ab of 53 or more based on JIS Z 8730 through the polyimide.

* * * * *

UNITED STATES PATENT AND TRADEMARK OFFICE
CERTIFICATE OF CORRECTION

PATENT NO. : 9,730,332 B2
APPLICATION NO. : 14/342288
DATED : August 8, 2017
INVENTOR(S) : Hideta Arai et al.

It is certified that error appears in the above-identified patent and that said Letters Patent is hereby corrected as shown below:

In the Claims

At Column 23, Line 56, "AB ($\Delta$B = Bt - Bb)" should be -- $\Delta$B ($\Delta$B = Bt - Bb) --.

At Column 25, Line 24, "AB ($\Delta$B = Bt - Bb)" should be -- $\Delta$B ($\Delta$B = Bt - Bb) --.

At Column 26, Line 7, "AB ($\Delta$B = Bt - Bb)" should be -- $\Delta$B ($\Delta$B = Bt - Bb) --.

Signed and Sealed this
Third Day of October, 2017

Joseph Matal
*Performing the Functions and Duties of the*
*Under Secretary of Commerce for Intellectual Property and*
*Director of the United States Patent and Trademark Office*